United States Patent [19]
Kaeriyama

[11] Patent Number: 6,150,214
[45] Date of Patent: Nov. 21, 2000

[54] TITANIUM NITRIDE METAL INTERCONNECTION SYSTEM AND METHOD OF FORMING THE SAME

[75] Inventor: Toshiyuki Kaeriyama, Ibaraki-Ken, Japan

[73] Assignee: Texas Instruments Incorporated, Dallas, Tex.

[21] Appl. No.: 09/196,732

[22] Filed: Nov. 20, 1998

Related U.S. Application Data

[60] Provisional application No. 60/066,714, Nov. 21, 1997.

[51] Int. Cl.[7] .................. H01L 21/8242; H01L 21/3205; H01L 21/4763; H01L 21/44
[52] U.S. Cl. .......................... 438/253; 438/238; 438/396; 438/587; 438/621; 438/627; 438/648; 438/649; 438/653; 438/655; 438/656; 257/295
[58] Field of Search ..................................... 438/586, 587, 438/620, 621, 627, 630, 637, 643, 648, 649, 653, 655, 656, 239, 253, 393, 396; 257/295

[56] References Cited

U.S. PATENT DOCUMENTS

| | | |
|---|---|---|
| 4,605,947 | 8/1986 | Price et al. .............................. 357/23.15 |
| 4,676,866 | 6/1987 | Tang et al. ................................ 156/643 |
| 4,804,636 | 2/1989 | Groover, III et al. ...................... 437/52 |
| 5,188,976 | 2/1993 | Kume et al. ............................... 435/52 |
| 5,210,047 | 5/1993 | Woo et al. ................................. 437/43 |
| 5,302,539 | 4/1994 | Haken et al. .............................. 437/41 |
| 5,436,477 | 7/1995 | Hashizume et al. ..................... 257/310 |
| 5,472,892 | 12/1995 | Gwen et al. ............................... 437/43 |
| 5,811,849 | 9/1998 | Matsuura ................................ 257/306 |
| 5,835,337 | 11/1998 | Watanabe et al. .................... 361/301.4 |
| 6,040,215 | 3/2000 | Takaishi ................................. 438/253 |

OTHER PUBLICATIONS

Jeong Soo Byung, Chang Reol Kim, Kwan Goo Rha, Jae Jeong Kim, Woo Shik Kim; Semiconductor Research Laboratory of GoldStar Electron Co., Ltd., Korea; (Received Sep. 12, 1994; accepted for publication Nov. 19, 1994). TiN/TiSi$_2$ Formation Using TiN$_x$ Layer and Its Feasibilies in ULSI. Jpn. J. Appl. Phys., vol. 34 (1995) pp. 982–986; Part 1, No. 2B, Feb. 1995.

Jeong Soo Byung, Jun Ki Kim, Jin Won Park, Jae Jeong Kim; ULSI Laboratory of LG Semicon Co., Ltd., Korea. W as a BIT Line Interconnection in COB Structures DRAM and Feasible Diffusion Barrier Layer. Extended abstract of the 1995 International Conference on Solid State Devices and Materials, Osaka, 1995, pp. 79–81.

H. Kotaki, M. Nakano, S. Hayashida, T. Matsuoka, S. Kakimoto, A. Nakano, K. Uda, Y. Sato; Central Research Laboratories, Sharp Corporation Analysis Center, (IC) Group, Sharp Corp., Japan. Novel Low Leakage and Low Resistance Titanium Salicide Technology with Recoil Nitrogen Achieved by Silicidation after Ion Implantation through Contamination–Restrained Oxygen Free LPCVD–Nitride Layer (SICRON). Extended abstract of the 1995 International Conference on Solid State Devices and Materials, Osaka, 1995, pp. 85–87.

(List continued on next page.)

*Primary Examiner*—Savitri Mulpuri
*Assistant Examiner*—Ha Tran Nguyen
*Attorney, Agent, or Firm*—Wade James Brady, III; Frederick J. Telecky, Jr.

[57] ABSTRACT

A method of fabricating a DRAM integrated circuit structure (30) and the structure so formed, in which a common interconnect material (42, 48) is used as a first level interconnection layer in both an array portion (30a) and periphery portion (30p) is disclosed. The interconnect material (42, 48) consists essentially of titanium nitride, and is formed by direct reaction of titanium metal (40) in a nitrogen ambient. Titanium silicide (44) is formed at each contact location (CT, BLC) as a result of the direct react process. Storage capacitor plates (16, 18) and the capacitor dielectric (17) are formed over the interconnect material (42, 48), due to the thermal stability of the material. Alternative processes of forming the interconnect material (42, 48) are disclosed, to improve step coverage.

11 Claims, 9 Drawing Sheets

OTHER PUBLICATIONS

Jeong Soo Byung, Jun Ki Kim, Jin Won Park, Jae Jeong Kim; ULSI Laboratory of LG Semicon Co., Ltd., Korea; (Received Sep. 19, 1995; accepted for publication Nov. 9, 1995). W as a Bit Line Interconnection in Capacitor–Over–Bit–line (COB) Structured Dynamic Random Access Memory (DRAM) and Feasible Diffusion Barrier Layer. Jpn. J. Appl. Phys. vol. 35 (1996) pp. 1086–1089; Part 1, No. 2B, Feb. 1995.

E. O Travis[∓], W. M. Paulson[∓], F. Pintchovski[∓], B. Boeck[∓], L.C. Parillo[∓], M.L. Kottkee[+], K.–Y. Fu[^], M.J. Rice[*], J.B. Price[*], E.C> Eichman[*]; ([∓] Motorola Inc., Advanced Products Research and development Lab, Austin, Texas), ([+] Motorola Inc., Advanced technology Center, Mesa, Arizona), ([^] Motorola Inc., MOS Mmeories R&QA, Austin, Texas), ([*]BCT Spectrum Inc. Phoenix, Arizona). A Scalable Submicron Contact Technology Using Conformal; LPCVD TiN. CH2865–4/90/0000–0047 $1.00 ©1990 IEEE; IEDM 90, pp. 47–50; pp. 3.3.1–3.3.4.

T. Kikkawa, H. Aoki, E. Ikawa, J. Drynan; Microelectronics Research Laboratories, NEC Corporation, Japan; A quarter–micron interconnection technology using Al–Si–Cu/SiN alternated layers.CH3075–9/91/0000–0281 $1.00 ©1991 IEEE; IEDM 91, pp. 281–284; pp. 10.5.1–10.5.4.

S. Nakamura, H. Horie, K. Asano, Y. Nara, T. Fukano, N. Sasaki; Fujitsu Laboratories Ltd., Japan. Giga–bit DRAM cells with low capacitance and low resistance bit–lines on buried MOSFET's and capacitors by using bonded SOI technology—Reversed–Stacked–Capacitor (RSTC) Cell–. 0–7803–2700–4 $4.00 ©1995 IEEE; IEDM 95 pp. 889–892; pp. 35.4.1–35.4.4.

J.Y. Lee, K.N. Kim, Y.C. Shin, K.H.Lee, J.S. Kim, D.H. Kim, D.H. Kim, J.W. Park, J.G. Lee, technology Development, Memory Device Business, Samsung Electronics Co., Korea. Simultaneously Formed Storage Node Contact and Metal Contact Cell(SSMC) for 1Gb DRAM and Beyond. 0–7803–3393–4 $5.00 ©1996 IEEE; IEDM 96 pp. 593–596; pp. 22.2.1–22.2.4.

S.P. Sim, W.S. Lee, Y.S. Ohu, H.C. Choe, J.H. Kim, H.D> Ban, I.C. Kim, Y.H. Chnag, Y.J. Lee, H.K. Kang, U.I. Chung, C.S. Choi, C.G. Hwang; Semiconductor R&D Center, Samsung Electronics Co LTD., Korea. A New Planar Stacked Technology (PST) for Sealed and Embedded DRAMs. 0–7803–3393–4 $5.00 ©1996 IEEE; IEDM 96 pp. 597–600; pp. 22.3.1–22.3.4.

TITANIUM NITRIDE METAL INTERCONNECTION SYSTEM AND METHOD OF FORMING THE SAME

CROSS-REFERENCE TO RELATED APPLICATIONS

This application claims priority, under 35 U.S.C. §119(e), of provisional application number 60/066,714, filed Nov. 21, 1997, and commonly assigned herewith.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed to interconnection systems and materials used therein.

Over recent years, many important advances have been made in the manufacture of integrated circuits, particularly in reducing the chip area required for the implementation of circuit elements. These advances include reduction in the critical dimensions of active elements such as transistors and interconnections, and the use of multiple interconnection layers in each integrated circuit. These advances have greatly increased the number of transistors that may be implemented in a given area, and thus greatly increased the functionality and performance of conventional integrated circuits, as well as reducing the manufacturing cost for such functionality.

However, the implementation of multiple interconnection layers introduces significant complexity in the design, layout, and manufacture of the integrated circuits, particularly as the feature sizes of the interconnections have become smaller, even into the submicron range. For example, modern integrated circuits such as high-density dynamic random access memories (DRAMs) may have on the order of five levels of interconnections; the formation and patterning of these multiple levels, as well as the provision of contacts among these levels of interconnections and contacts from interconnection levels to active devices (including the bulk silicon), can therefore become quite complex. Furthermore, as interconnect feature sizes become very small, the conductivity of individual interconnections becomes a concern, and as such the selection of the appropriate material for individual interconnection layers can become a relatively complex decision. Additional complications in the implementation of such interconnection layers also result from processing considerations, particularly where the integrated circuit wafers must be subjected to high temperature processing at a point in the manufacturing flow after the deposition and patterning of one or more of the interconnection layers.

An example of a conventional DRAM device constructed according to complementary metal-oxide-semiconductor (CMOS) technology, and illustrating multiple interconnection layers, is illustrated in FIGS. 1 and 2. FIG. 1 illustrates two portions of partially-fabricated integrated circuit 20, namely array portion 20a and periphery portion 20p formed at a surface of p-type substrate 2. Specifically, periphery portion 20p as shown in FIG. 1 includes a p-channel transistor having source/drain regions 6 formed within n-well 4, at locations defined by field oxide structures 5 and gate structure 8; gate structure 8 is vertically separated from the channel region between source/drain regions 6 by a gate dielectric, in the conventional manner. Gate structures 8 may be encapsulated, as shown in FIG. 1, to permit contacts for subsequent interconnection layers to be made in a self-aligned manner relative to gate structures 8, without shorting thereto. Of course, n-channel periphery transistors will also be implemented in periphery portion 20p, within a p-type well, but are not shown in FIGS. 1 and 2 for the sake of clarity.

In this example, insulating material 10 collectively refers to multiple insulating layers, which may include a barrier layer, a doped oxide (BPSG) layer and additional insulating layers that overlie gate structure 10. First-level metal conductor 22 makes contact to one of source/drain regions 6, through a contact opening etched through overlying insulating material 10 at that location. Additional metallization layers, such as second-level metal 24 and third-level metal 26 are similarly formed in periphery portion 20p as shown in FIG. 1, physically and electrically insulated from one another by additional levels of insulating material 10 with vias therethrough for purposes of electrical connection.

Array portion 20a of integrated circuit 20 contains, in the portion illustrated in FIG. 2a, two storage capacitors which are formed in a "crown" fashion, as described in further detail in commonly assigned copending application Ser. No. 08/845,755, filed Apr. 25, 1997, entitled "A Silicon Nitride Sidewall and Top Surface Layer Separating Conductors", incorporated hereinabove by reference. In this example, the storage capacitors are formed by field plate 18 that is electrically coupled to a fixed voltage, and separated from individual second plates 16 by capacitor dielectric layer 17. Each of plates 16, 18 is preferably formed of polysilicon, while capacitor dielectric layer 17 may be formed of silicon dioxide, of silicon nitride, or of a sandwich structure of silicon dioxide and silicon nitride, as known in the DRAM art. Plates 16 are respectively connected to polysilicon plugs 12 and thus to n-type source drain regions 7 at the surface of p-type well 9; the location of which are defined by field oxide structures 5 and gate structures 8. Well 9 is formed within deep n-type well 3, at a surface of p-type substrate 2.

Bit line 15 also extends laterally above gate structures 8 and field oxide structures 5, separated therefrom by one of the layers of insulating material 10, while gate structures 8 for some distance along array portion 20a, perpendicularly relative to bit line 15, to control connection of the storage capacitors to their respective bit lines, in the usual manner for DRAMs. As shown in FIGS. 1 and 2, bit line 15 makes contact to source/drain regions 7 both directly and indirectly. Within array portion 20a, between adjacent storage cells, bit line 15 extends into and through a bit line contact BLC (FIG. 2) to make contact to source/drain region 7. Away from the storage cells, first level metallization layer 22 is also provided to strap bit line 15 to another source/drain region 7. Second-level metal layer 24 and third-level metal layer 26 are also provided in array portion 20a, to provide interconnection among the various circuit elements.

As is evident from FIGS. 1 and 2, bit line 15 is formed prior to the formation of capacitor plates 16, 18, and as such must have sufficient thermal stability to be able to withstand the temperature sequence used in the formation of plates 16, 18, as well as capacitor dielectric 17 therebetween. Accordingly, in this conventional arrangement of FIGS. 1 and 2, bit line 15 must be formed of a material that can withstand such processing. One particular example of such material is silicide-clad polysilicon, such as tungsten polycide. Alternatively, a multi-layer structure of n+ doped polysilicon (when contacting n-type source/drain regions as illustrated in FIGS. 1 and 2) stacked with tungsten disilicide may also be used. These materials differ quite radically from conventional aluminum metallization as used in metal layers 22, 24, 26, as such metallization is not able to withstand processing temperatures above 450° C., and as such cannot withstand the processing required to form capacitor plates 16, 18 and capacitor dielectric 17.

However, these materials are not suitable for use as a first level metal interconnection layer in periphery portion 20p, or even within array portion 20a, due to the relatively high contact resistance provided by these materials, and also because these materials do not present a barrier to the diffusion of dopant (of either n-type or p-type) or of silicon therethrough. As a result, first level metal layer 22 is necessary in the conventional DRAM integrated circuit structure of FIGS. 1 and 2 to provide interconnection to elements in periphery portion 20p, and as a strap connection from bit line 15 to source/drain region 7 as shown.

As is evident from the conventional arrangement of FIGS. 1 and 2, the interconnections are quite complex in this DRAM device. Specifically, five interconnection layers are present in this conventional arrangement, three of which are metal, plus bit line 15 and gate structures 8. As such, this structure involves significant manufacturing cost and yield risk from each of these interconnection levels. Furthermore, in the case where bit line 15 is formed of doped polysilicon, connection of bit line 15 to p-type doped regions 6 is not possible, due to the counterdoping effects.

By way of further background, titanium nitride is a known conductive material in the field of integrated circuits. The formation of local interconnections from titanium nitride for active transistor elements as a by-product of direct react silicidation is described in U.S. Pat. No. 4,676,866, U.S. Pat. No. 4,804,636, and U.S. Pat. No. 5,302,539, each commonly assigned herewith and incorporated by reference hereinto. The use of deposited titanium nitride as a gate electrode is described in U.S. Pat. No. 4,605,947. The use of titanium nitride as a barrier layer or adhesion layer (or both) in a multiple-level metallization layer is disclosed in Travis, et al., "A Scalable Submicron Contact Technology Using Conformal LPCVD TiN", *International Electron Device Meeting* (IEEE, 1990), pp. 47–50; Kikkawa, et al., "A quarter-micron interconnection technology using Al—Si—Cu/TiN alternated layers", *International Electron Device Meeting* (IEEE, 1991), pp. 281–284. Use of titanium nitride adhesion or barrier layers in DRAM devices is described in Nakamura, et al. "Giga-bit DRAM cells with low capacitance and low resistance bit-lines on buried MOSFET's and capacitors by using bonded SOI technology—Reversed-Stacked-Capacitor (RSTC) Cell", *International Electron Device Meeting* (IEEE, 1995), pp. 889–892; Lee, et al. "Simultaneously Formed Storage Node Condact and Metal Contract Cell (SSMC) for 1 Gb DRAM and Beyond", *International Electron Device Meeting* (IEEE, 1996), pp. 593–596, and in Byun, et al. "W as a BIT Line Interconnection in COB Structured DRAM and Feasible Diffusion Barrier Layer", *Extended Abstracts of the 1995 International Conference on Solid State Devices and Materials* (Osaka, Japan, 1995), pp. 75–81.

BRIEF SUMMARY OF THE INVENTION

It is an object of the present invention to provide a method of fabricating an integrated memory circuit, and a memory circuit formed thereby, in which a single conductive layer may be used for bit line structures in the memory array and also for a first metal interconnection layer.

It is a further object of the present invention to provide such a method and structure in which high-temperature processing may be performed after the fabrication of the conductive layer.

It is a further object of the present invention to provide such a method and structure in which the conductive layer may be used to contact both n-doped and p-doped regions.

It is a further object of the present invention to provide such a method and structure in which the conductive layer is formed of titanium nitride.

Other objects and advantages of the present invention will be apparent to those of ordinary skill in the art having reference to the following specification together with its drawings.

The present invention may be implemented into an integrated memory circuit having an array portion and a peripheral portion, by providing a bit line level in the array portion and a first interconnect level in the periphery portion that are formed from the same layer of conductive material. The conductive material is a refractory metal or metal compound through which dopant does not readily diffuse; a preferred example of the conductive material is titanium nitride.

DETAILED DESCRIPTION OF THE INVENTION

As will become apparent from the following description, the present invention is particularly beneficial in integrated circuits such as DRAMs having complex structures above and insulated from the active devices in the semiconductor bulk. However, it is contemplated that the present invention will also be beneficial in integrated circuits of other types, including logic circuits such as microprocessors and digital signal processors, and in integrated circuits fabricated according to other technologies including bipolar, BiCMOS, and single channel-type (e.g., n-channel) MOS, either in bulk silicon or in silicon-on-insulator (SOI) semiconductor material.

Figure 1:
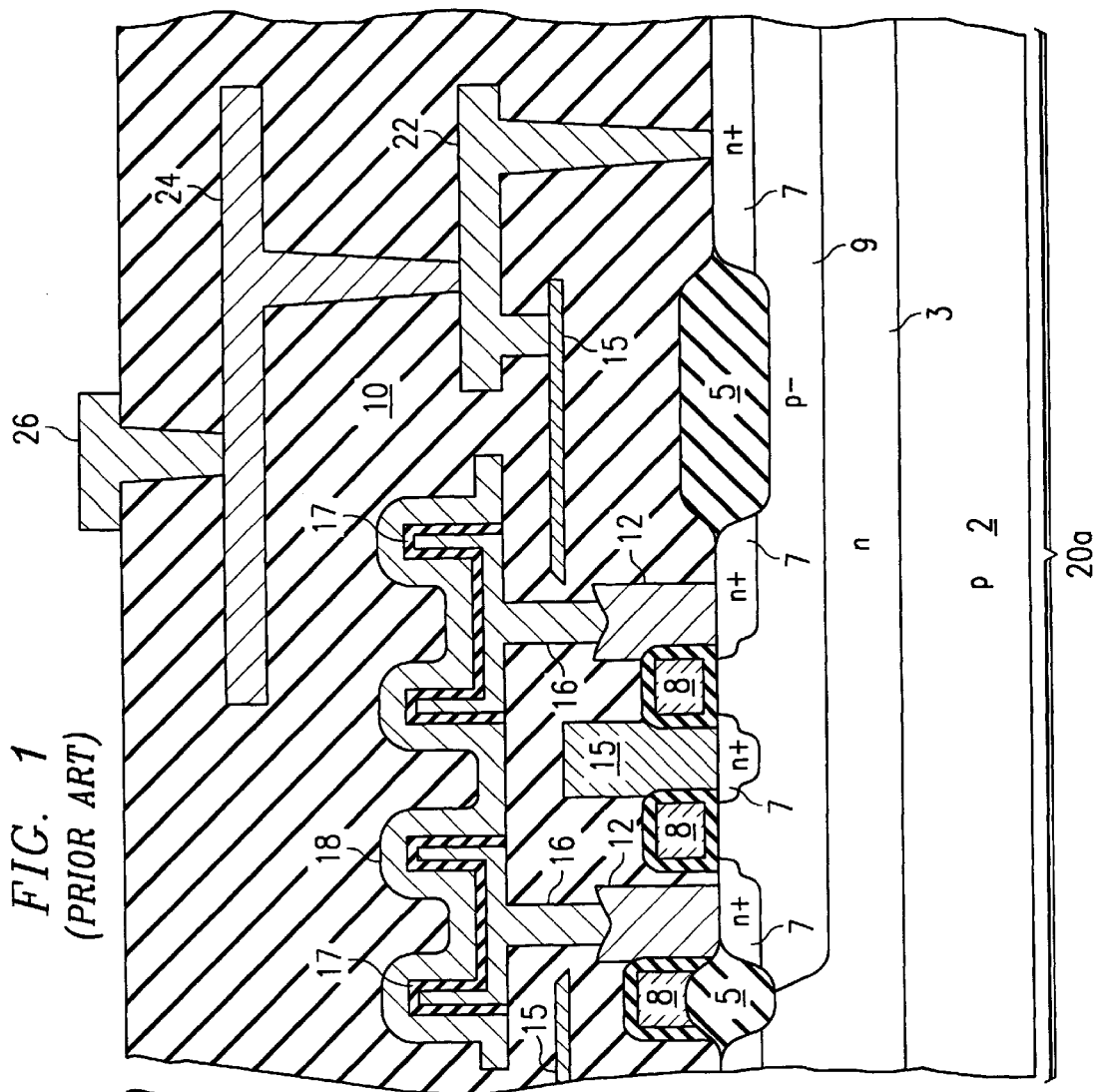
FIG. 1 is a cross-sectional view of a DRAM integrated circuit according to the prior art.
Figure 1:
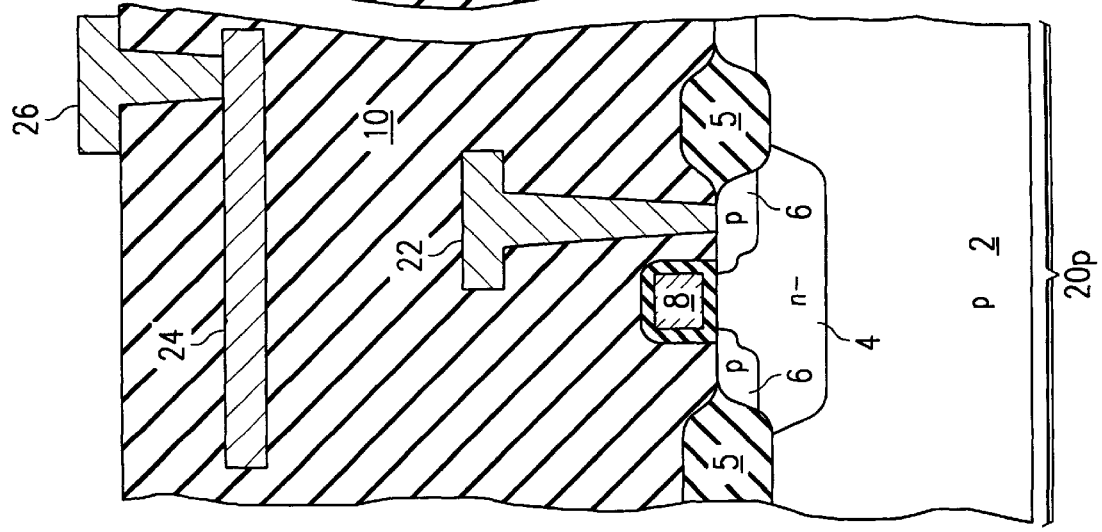
Figure 2:
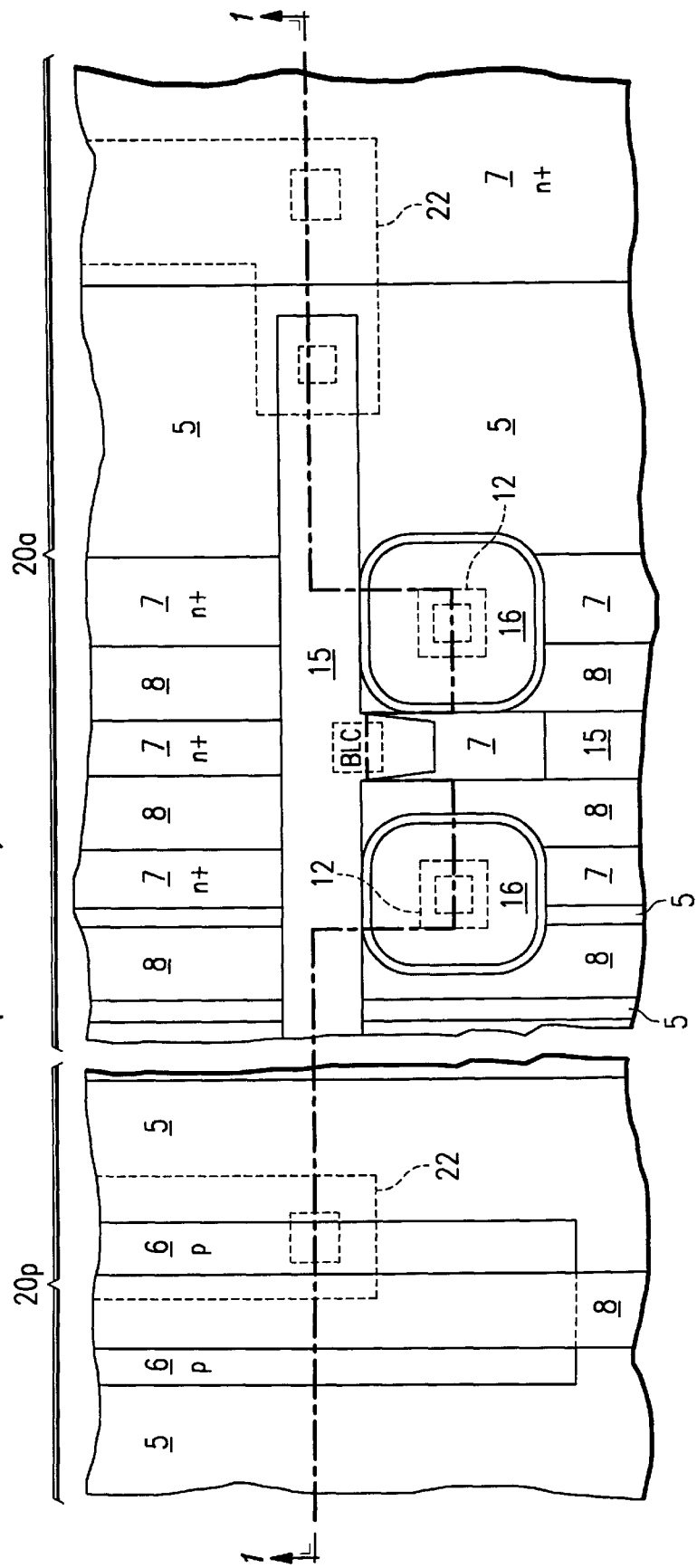
FIG. 2 is a plan view of the conventional DRAM integrated circuit of FIG. 1.
Figure 3:
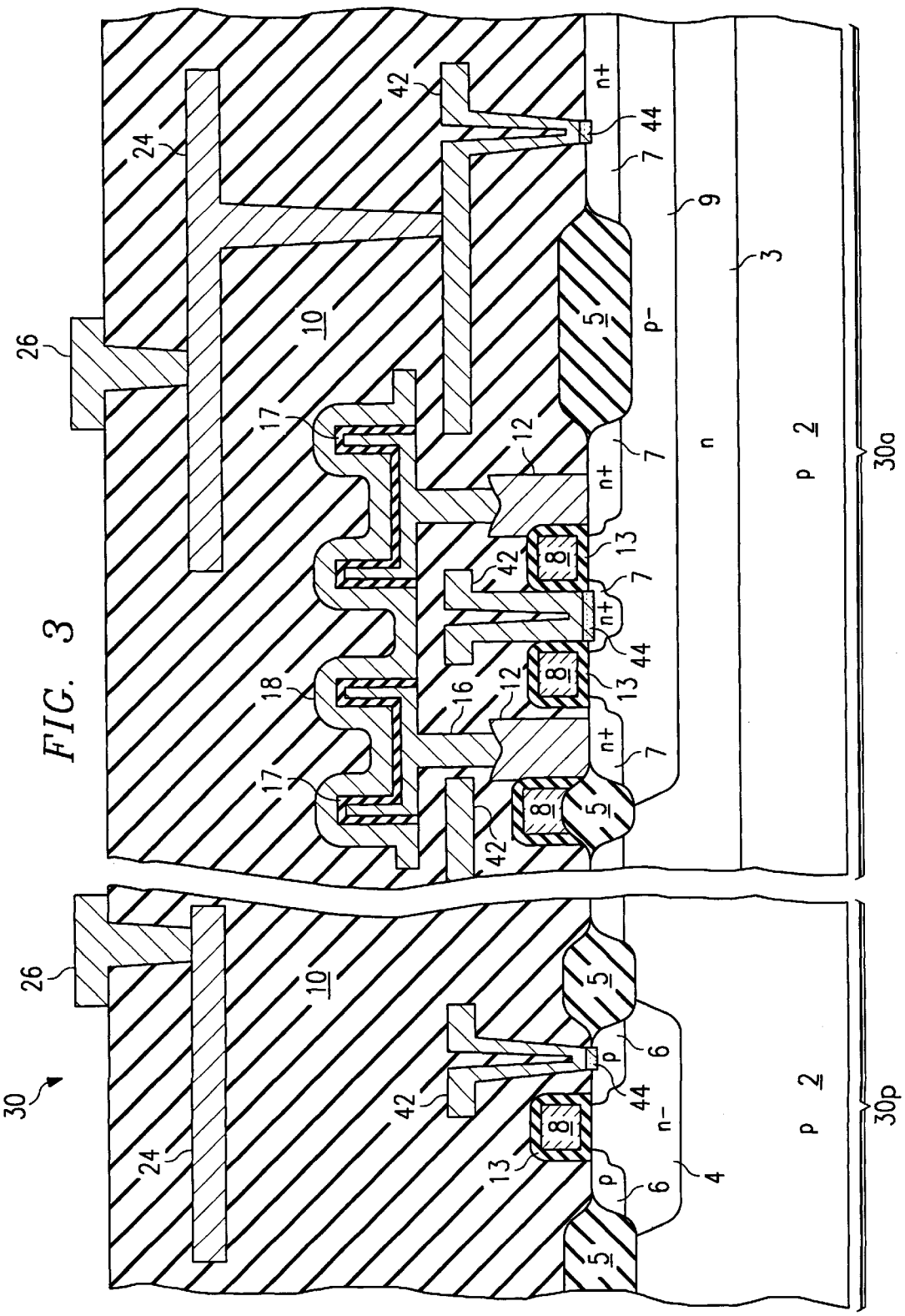
FIG. 3 is a cross-sectional view of a DRAM integrated circuit constructed according to the first preferred embodiment of the present invention.
Figure 4:
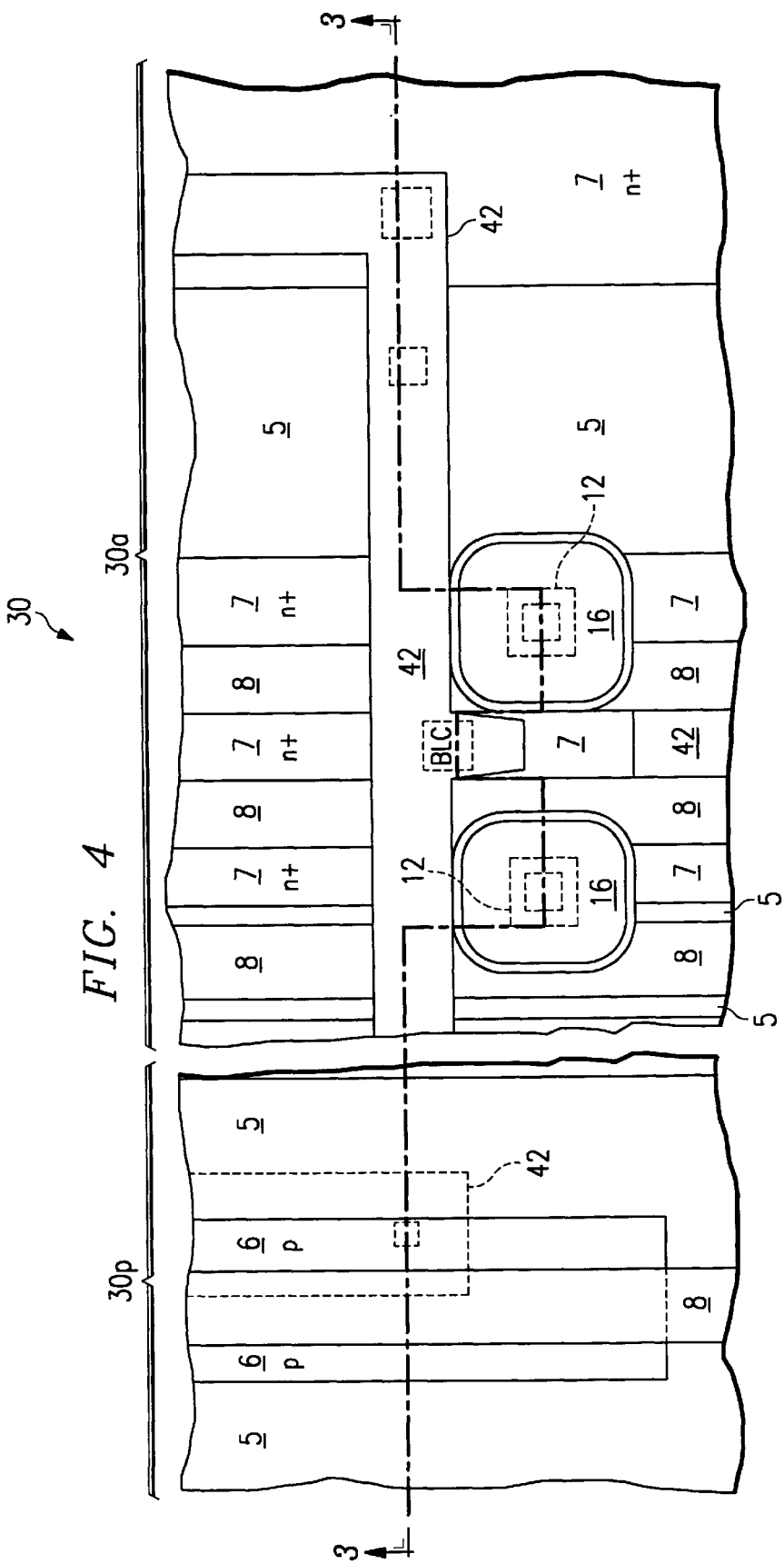
FIG. 4 is a plan view of the DRAM integrated circuit of FIG. 3.

Referring first to FIGS. 3 and 4, the construction of a DRAM integrated memory circuit 30 according to a first preferred embodiment of the present invention will now be described. DRAM integrated memory circuit 30 includes array portion 30a and peripheral portion 30p. For ease of explanation, similar elements in DRAM integrated circuit 30 as are present in the conventional DRAM integrated circuit discussed above relative to FIGS. 1 and 2 are indicated by the same reference numerals. Array portion 30a includes storage cells in the form of capacitors, as typical for DRAMs, formed by plates 16, 18 and dielectric 17, as before. Peripheral portion 30p of DRAM integrated circuit 30 includes p-channel transistors (including source and drain regions 6, and gate structure 8), and preferably also includes n-channel transistors (not shown) to permit logic, clock, address, data sensing, and data communication circuitry to be realized in complementary metal-oxide-semiconductor (CMOS) technology. Of course, the present invention may also be implemented in other technologies, including those utilizing only n-channel or only p-channel MOS devices.

According to this first preferred embodiment of the invention as illustrated in FIGS. 3 and 4, interconnect material 42 is provided within both array portion 30a and peripheral portion 30a, and serves as a first level interconnection level that is above the gate level (i.e., formed after, and thus disposed above, gate structures 8). Specifically, interconnect material 42 is in contact with p-type source/drain region 6 in peripheral portion 30p (and also with n-type source/drain regions in peripheral portion 30p, not shown). Such contact with source/drain regions is made at a location thereof that is clad with silicide film 44, as shown in FIG. 3; while each contact of interconnect material 42 is made by way of silicide film 44, due to the method of manufacture as will be noted hereinbelow, it is of course contemplated that source/drain region 6 and other elements, such as gate structures 8, may also be silicide-clad along their entire length.

In array portion 30a, interconnect material 42 serves as the bit line. In this regard, interconnect material 42 is in contact, via silicide film 44, with n-type source/drain regions 7 through bit line contacts BLC (FIG. 4) for example at locations between capacitor plugs 12, and also runs along array portion 30a to communicate the state of addressed DRAM cells. Further, interconnect material 42 may make contact to n-type source/drain regions 7 (and also p-type source/drain regions, if available in array portion 30a) away from the storage cells, for example as shown in FIGS. 3 and 4.

In both array portion 30a and peripheral portion 30p, metal layer 24 may make contact to interconnect material 42 at contact locations, such as shown in array portion 30a in FIG. 3. Upper level metal layer 26 may then make contact to metal layer 24 through vias, in the conventional manner.

As will be described in further detail hereinbelow, interconnect material 42 is selected from a material that has sufficient thermal stability to withstand high temperature processing, such as that required to form DRAM capacitor plate structures 16, 18, and dielectric layer 17 therebetween, as in this example of cell-over-bitline ("COB") DRAM integrated circuit 30. For example, temperatures as high as 850° C. are not uncommon in the formation of these structures, particularly the formation of capacitor dielectric layer 17; of course, conventional aluminum metallization cannot withstand such high temperatures, even for a brief duration. Secondly, since interconnect material 42 is making contact to both n-type and p-type materials (perhaps with the same structure), interconnect material 42 is preferably a substantial diffusion barrier to dopant and to silicon atoms. Thirdly, interconnect material 42 must also be able to make a good ohmic contact, with low contact resistance, to source/drain regions 6, 7, so as to not degrade the switching times within DRAM integrated circuit 30.

According to the preferred embodiments of the present invention, interconnect material 42 consists essentially of titanium nitride, as titanium nitride provides each of the characteristics of thermal stability, diffusion barrier properties, and (via silicide film 44) low contact resistance to doped silicon. It is contemplated that other materials having these characteristics may alternatively be used for interconnect material 42. For example, it is contemplated that zirconium nitride may also be suitable for use as interconnect material 42, as its electrical resistivity is sufficiently low, and because zirconium silicide provides at least fair contact resistance to silicon. While nitrides of other materials from periods IV, V, VI of the periodic table may alternatively be used, it is contemplated that, after titanium nitride and zirconium nitride, these other materials are less suitable.

Figure 5A:
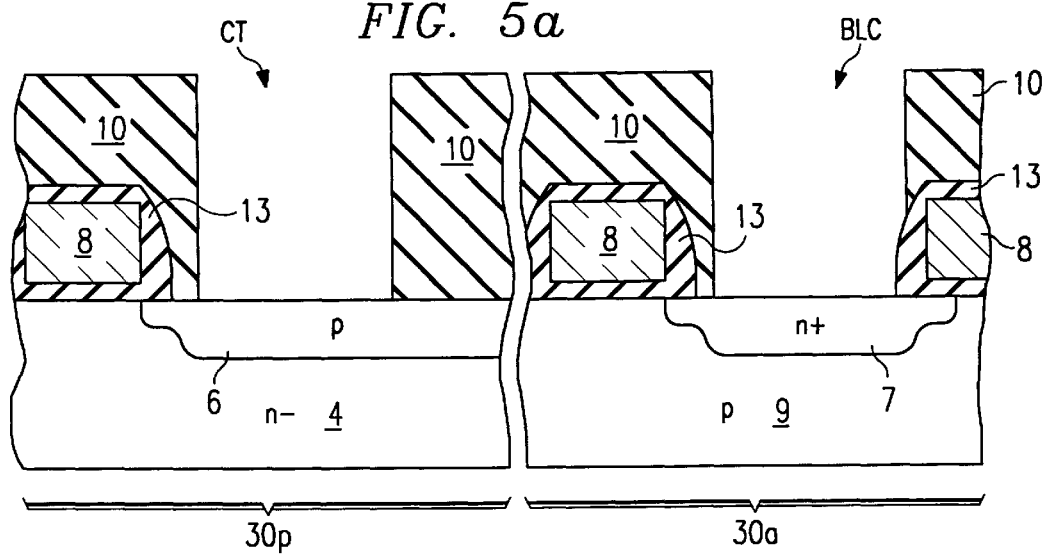
FIGS. 5a through 5d are cross-sectional views of the integrated circuit of FIG. 3 in selected stages in its manufacture, according to the first preferred embodiment of the present invention.

Referring now to FIGS. 5a through 5d, a process of forming interconnect material 42 into interconnections within DRAM integrated circuit 30 (for example as shown in FIGS. 3 and 4), will now be described in detail. The view of FIG. 5a begins at a point in the process after the formation of gate structures 8 and source/drain regions 6, 7. Gate structures 8 are preferably encapsulated with insulating material 13, such as silicon nitride, to permit contacts for subsequent interconnection layers to be made in a self-aligned manner relative to gate structures 8, without shorting thereto. A first layer of interlevel dielectric material 10 has been disposed overall, for example to a thickness on the order of one micron, and contact locations have been etched therethrough by way of conventional photolithographic and etch processes. As illustrated in FIG. 5a, the etch stops on encapsulating material 13 over those portions of gate structures 8 that are exposed within the contact locations, such that the contact locations are self-aligned relative to gate structures 8; this may be provided by way of a selective etch, for example where interlevel dielectric material 10 consists of silicon dioxide and where the encapsulating material 13 includes silicon nitride. In the exemplary views of FIG. 5a, contact location CT is illustrated in peripheral portion 30p and bit line contact location BLC is illustrated in array portion 30a, each etched through interlevel dielectric 10. It is contemplated that contact locations CT, BLC, may be made very small, for example on the order of $0.3\mu$ in diameter.

Figure 5B:
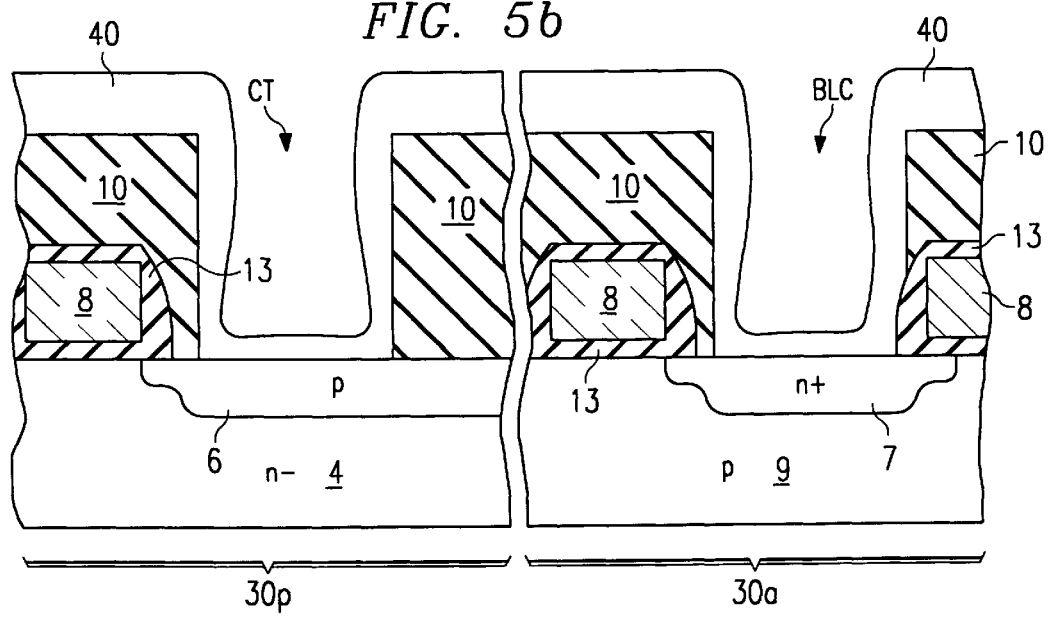

Following the etching of contacts CT, BLC and any appropriate cleanup, a layer of titanium metal 40 is formed overall, preferably by way of sputtering to a thickness on the order of 500 Å to 2000 Å. The resultant structure is illustrated in FIG. 5b, in which titanium metal 40 forms a single conductive layer, extending into contact locations CT, BLC, and contacting the underlying source/drain regions 6, 7 thereat.

Figure 5C:
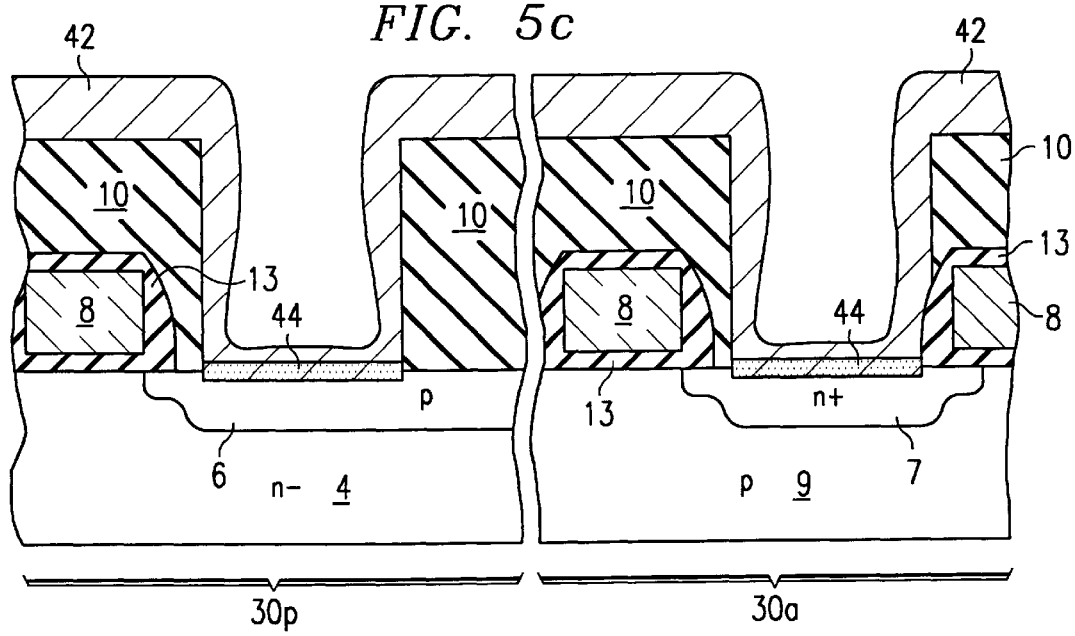

The structure is next heated, either in a nitrogen ambient or alternatively in a nitrogen-based forming gas (e.g., a mixture of hydrogen and nitrogen), to effect direct react silicidation of titanium metal 40. The temperatures to which the structure is subjected to perform this process may range from 550° C. to 750° C., as known in the art. As illustrated in FIG. 5c, those portions of titanium metal 40 in contact locations CT, BLC react with the underlying silicon of source/drain regions 6, 7 to form titanium disilicide film 44; as is known in the art, titanium disilicide is an extremely good electrical conductor, and as such its use in contacts provides very low contact resistance. Because of the presence of nitrogen ambient, those portions of titanium metal layer 40 that are not in contact with silicon, but which instead are in contact with interlevel dielectric 10, react with the nitrogen to form titanium nitride interconnect material 42. Titanium nitride interconnect material 42 may not necessarily be a uniform layer of TiN, but instead will have varying stoichiometry (i.e., $Ti_xN_y$, with varying and non-integer values for x, y), and indeed may include oxygen from interlevel dielectric 10 (i.e., $Ti_xO_yN_z$). In any event, titanium nitride interconnect material 42 is a relatively good conductor, and as discussed above relative to FIGS. 3 and 4, will be used as first interconnection layer in both array portion 30a and periphery portion 30p. The direct reaction process is continued, preferably until the converted titanium nitride (layer 42) reaches silicide film 44, with silicide film 44 reaching the converted titanium nitride layer 42 from the bottom side (i.e., from silicon upward). The reaction stops at the boundary where titanium nitride and titanium silicide meet one another. For example, an anneal of from about 580° C. to about 700° C. in a nitrogen ambient for approximately sixty minutes is sufficient to convert a 1000 Å film of titanium into titanium nitride.

Following its formation, titanium nitride interconnect material 42 is patterned by conventional photolithographic processes to define the interconnection pattern, and is then etched with the photolithographic mask (developed photoresist, or silicon dioxide or another hardmask material), to define the conductors; the mask material is then stripped in the usual manner.

An example of a suitable etch is carried out in a microwave ECR etcher, such as available from Hitachi under Model No. M501A. An example of etch conditions in this apparatus includes a microwave frequency of 2.45 GHz at a power of 900 Watts, using a substrate RF bias frequency of 2 MHz at a power of 90 Watts; coil currents for the magnetic field were set at 20A/16A/8A (H/M/L). In this exemplary etch, the etchant species is chlorine ($Cl_2$), at a flow of 200 sccm. Wafer temperature is maintained at 18° C. with a chamber temperature of 80° C., and a chamber pressure of 2 Pa; the voltage $V_{pp}$ is set to 230 volts, and electrode height is 80 mm. Successful etching of titanium nitride under these etch conditions has been observed and, through use of ECR etch, this etch is believed to be suitable for submicron features and thus suitable for use in the preferred embodiment of the invention.

Figure 5D:
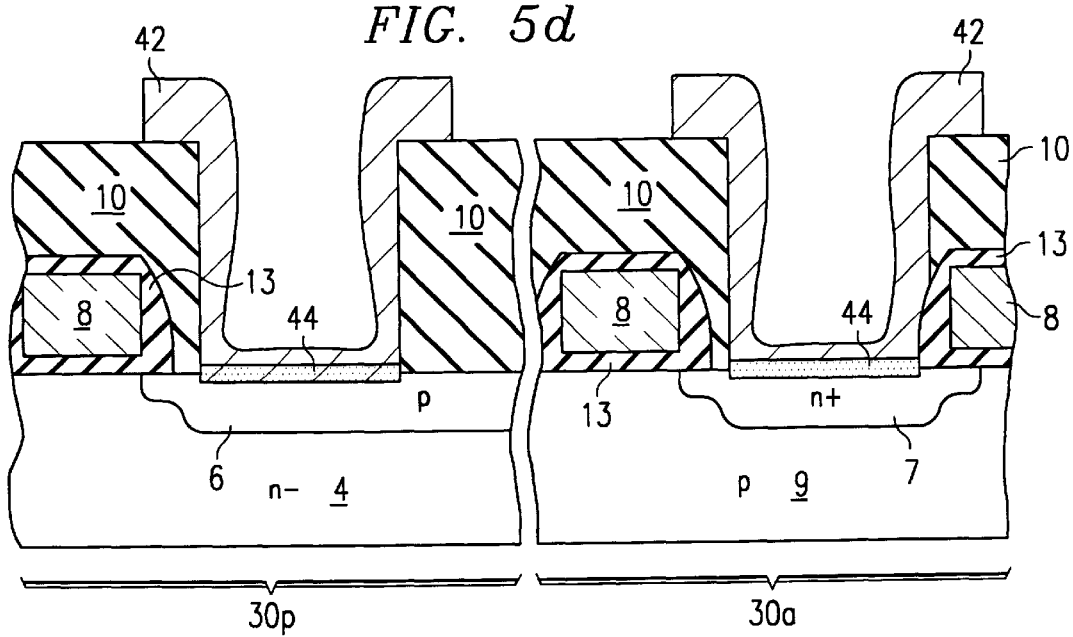

The result of this etching defines interconnects formed of titanium nitride 42, in contact with source/drain regions 6, 7 via silicide film 44, and present in both array portion 30a and peripheral portion 30p of DRAM integrated circuit 30, as illustrated in FIG. 5d.

The deposition of additional dielectric material 10, and the formation of metal levels 24, 26, is then carried out as before, resulting in the structure illustrated in FIGS. 3 and 4 discussed hereinabove. Such "back-end" processing as electrical test, packaging, burn-in, and additional electrical testing, may then be performed; it is understood that such back-end processing shall not constitute a material change in the product described herein.

As a result of this process, titanium nitride interconnect material 42 provides a first level of interconnection, including interconnection to both n-type and p-type doped silicon structures, and which may be subjected to subsequent high temperature processing as noted hereinabove. Furthermore, titanium nitride interconnect material 42 serves as a good diffusion barrier to dopant ions such as boron and phosphorous, and is thus suitable for use as connections to both n-type and p-type regions.

Figure 6A:
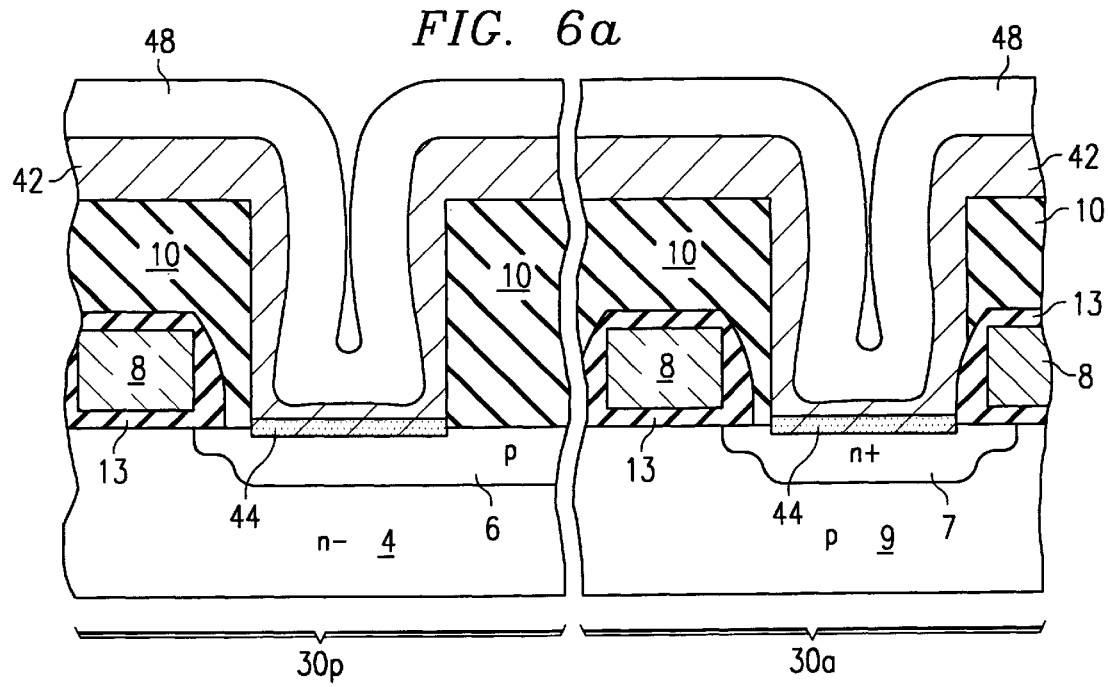
FIGS. 6a and 6b are cross-sectional views of selected stages in the manufacture of an integrated circuit according to a second preferred embodiment of the present invention.
Figure 6B:
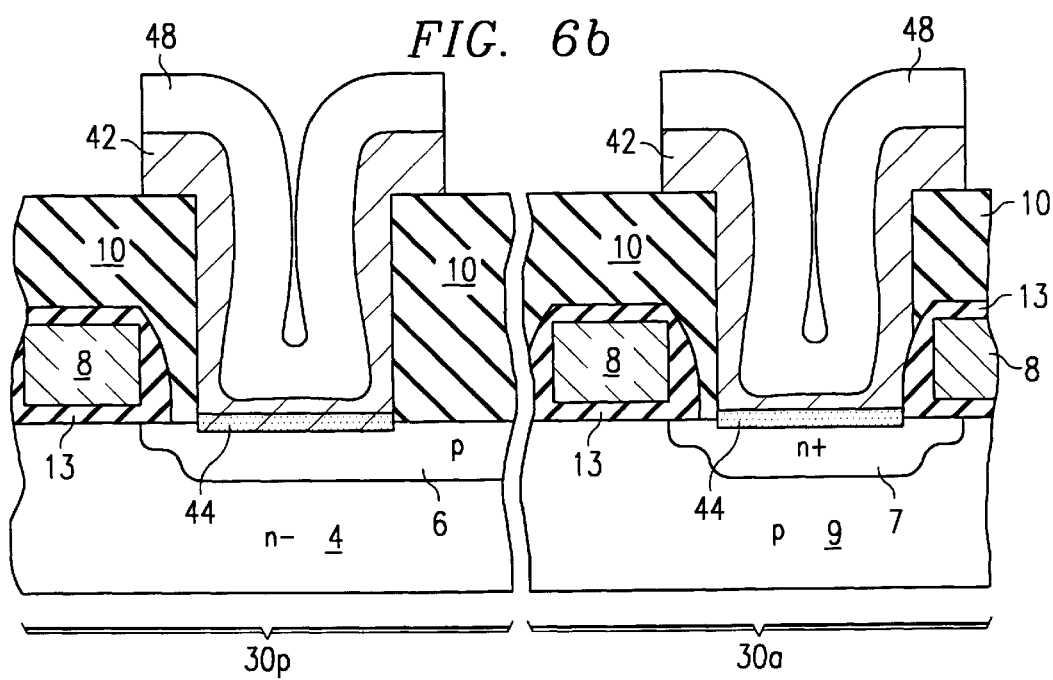

Referring now to FIGS. 6a and 6b, an alternative embodiment of the present invention will now be described in detail. Specifically, FIGS. 6a and 6b illustrate an alternative process by way of which the step coverage of the first interconnection layer including titanium nitride interconnect material 42 may be improved.

FIG. 6a illustrates the state of manufacture of integrated circuit 30 after the completion of the direct react process; as such, silicide film 44 is present in the contact openings, and titanium nitride interconnect material 42 is present overall, where not in contact with the underlying silicon. According to this embodiment of the present invention, an additional titanium nitride layer 48 is formed overall, preferably by chemical vapor deposition (CVD). As is evident from FIG. 6a, CVD titanium nitride layer 48 provides additional thickness to titanium nitride interconnect material 42, particularly in providing step coverage into steep contacts such as contact locations CT, BLC. As illustrated in FIG. 6b, the stacked structure of direct react titanium nitride interconnect material 42 and CVD titanium nitride layer 48 is then patterned and etched (it being contemplated that the same etch may be used for both layers, due to their chemical similarity), thus forming the desired electrical conductors at the surface of integrated circuit 30. As a result of this embodiment of the invention, not only will overall conductivity of this first interconnection level be reduced by the additional thickness, but the manufacturing process will also be more robust in light of the improved step coverage.

Figure 7A:
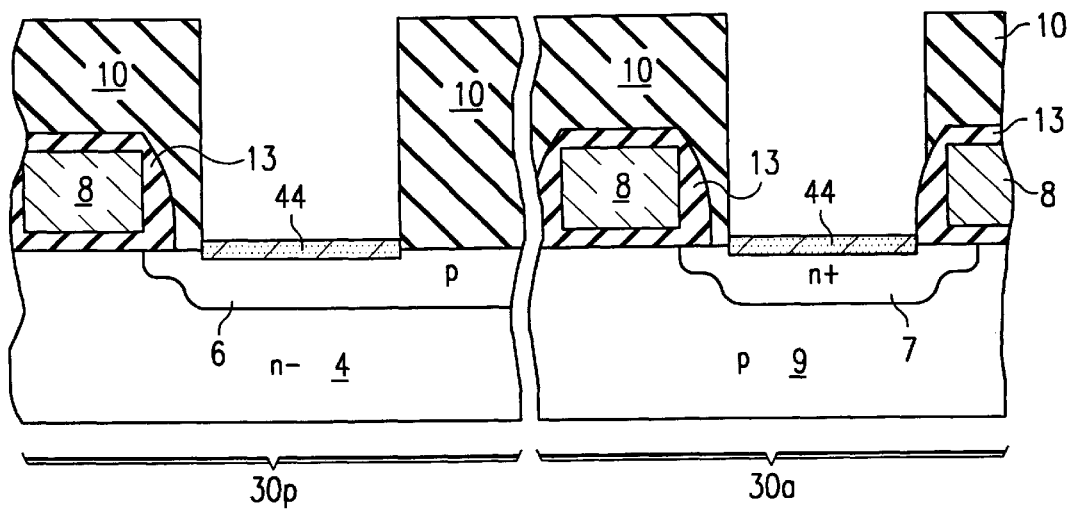
FIGS. 7a through 7c are cross-sectional views of selected stages in the manufacture of an integrated circuit according to a third preferred embodiment of the present invention.
Figure 7B:
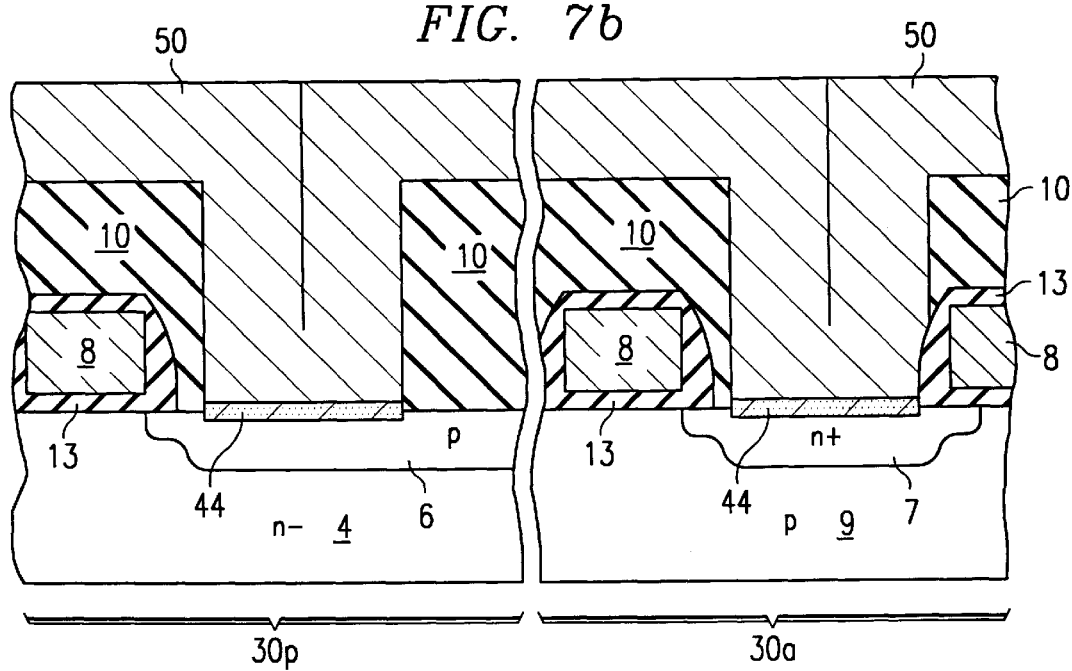
Figure 7C:
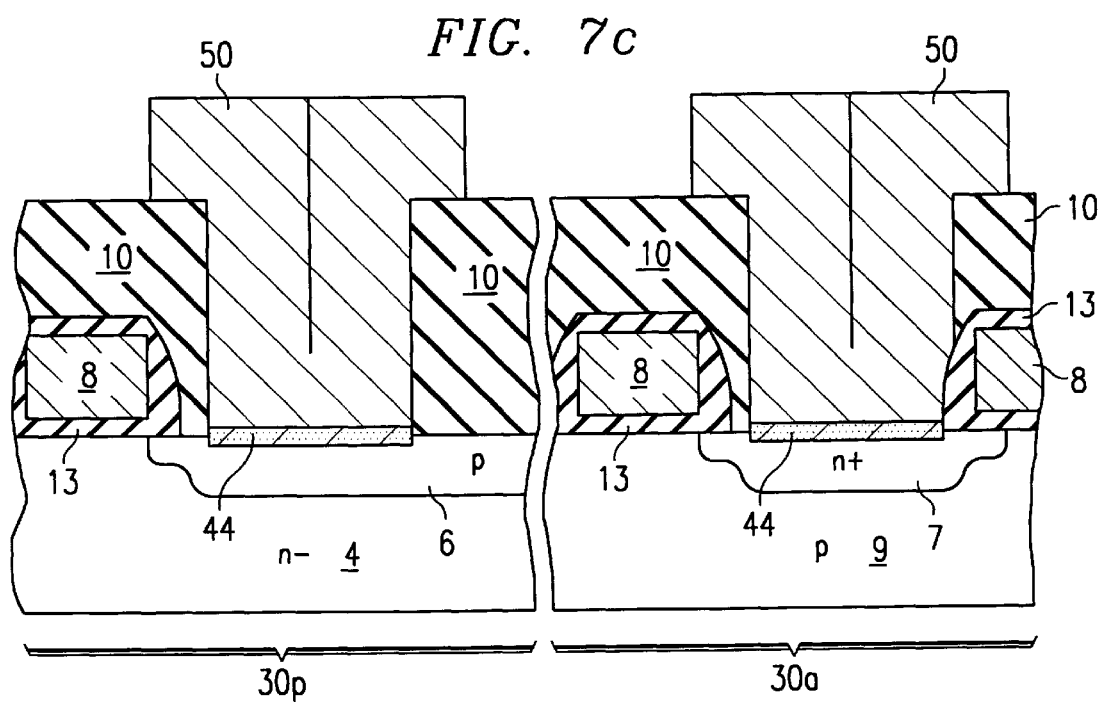

Referring now to FIGS. 7a through 7c, another preferred embodiment of the present invention will be described, beginning with the point in the process following the direct react silicidation and conversion of titanium metal layer 40 into titanium nitride 42. According to this embodiment of the present invention, the converted titanium nitride interconnect material 42 is fully removed, preferably by a blanket etch that is selective to titanium silicide and silicon dioxide; an example of such a selective blanket etch is a wet chemical etch, using the well-known mixture of $NH_4OH$, $H_2O_2$, and $H_2O$. As a result of this etch, silicide film 44 remains in the contact openings CT, BLC, as shown in FIG. 7a.

According to this alternative embodiment of the present invention, titanium nitride layer 50 is then deposited overall, preferably by way of CVD. In this example, CVD titanium nitride layer 50 of a thickness on the order of 2000 Å preferably fills contact openings CT, BLC. This CVD deposition is then followed by conventional photolithographic patterning, and etching, to form the locations of the conductors desired in the particular circuit. FIG. 7c illustrates, in cross-section, the construction of DRAM integrated circuit 30 at this point, accoridng to this alternative embodiment of the invention. The deposited titanium nitride is as thermally stable and electrically conductive as the direct react titanium nitride byproduct, and because of the provision of silicide film 44, makes excellent contact to the underlying source/drain regions 6, 7.

As described above, in any of these alternatives, a first interconnection layer may be formed prior to the fabrication of high-temperature structures, such as memory capacitors. This interconnection layer is of a material that inhibits dopant diffusion, and as such may be used to contact both n-type and p-type source/drain regions. Finally, the silicide film underlying the interconnections at the contact locations greatly reduces the contact resistance, thus preserving the performance of the integrated circuit. The use of a single material, and process, for the fabrication of such a layer in both the memory array and also in the periphery, greatly reduces the manufacturing cost of these devices.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A method of fabricating an integrated memory circuit at a semiconducting surface of a body, the integrated memory circuit having both an array portion and a periphery portion, comprising:

forming gate structures near doped regions of the surface in both of the array portion and the periphery portion;

forming an interlevel dielectric layer over the gate structures and the doped regions;

etching contact openings through the interlevel dielectric layer to expose selected locations of the doped regions in both of the array portion and the periphery portion;

forming a layer of interconnect material over the interlevel dielectric and into the contact openings in both of the array portion and the periphery portion, so as to make electrical contact with the selected locations of the doped regions, the interconnect material having the properties of stability when subjected to temperatures above a first temperature, and being substantially a barrier to diffusion of dopant from the doped regions;

etching the layer of interconnect material to provide interconnections in both of the array portion and the periphery portion; and then forming capacitor structures overlying the layer of interconnect material in the array portion; wherein the interconnect material consists essentially of titanium nitride; and wherein the step of forming the layer of interconnect material also forms a silicide film between the layer of interconnect material and the selected locations of the doped regions.

2. The method of claim 1, wherein the doped regions include both p-type and n-type doped regions.

3. The method of claim 1, wherein the step of forming the layer of interconnect material also forms a silicide film between the layer of interconnect material and the selected locations of the doped regions.

4. The method of claim 1, wherein the step of forming the layer of interconnect material comprises:

depositing a layer comprising titanium metal over the interlevel dielectric layer, and into the contact locations in both of the array portion and the periphery portion; and heating the body in a nitrogen ambient, so that the titanium metal reacts with the doped regions at the selected locations to form a titanium silicide film thereat, and so that remaining portions of the titanium metal converts into titanium nitride.

5. The method of claim 4, wherein the step of forming the layer of interconnect material further comprises:

After the heating step and prior to the step of etching the interconnect material, depositing a layer consisting essentially of titanium nitride overall.

6. The method of claim 5, wherein the step of forming the layer of interconnect material further comprises:

after the heating step and prior to the step of depositing the layer consisting essentially of titanium nitride, removing the titanium nitride layer formed in the heating step.

7. A method of fabricating an integrated memory circuit at a semiconducting surface of a body, the integrated memory circuit having both an array portion and a periphery portion, comprising:

forming gate structures near doped regions of the surface in both of the array portion and the periphery portion;

forming an interlevel dielectric layer over the gate structures and the doped regions;

etching contact openings through the interlevel dielectric layer to expose selected locations of the doped regions in both of the array portion and the periphery portion;

forming a layer of interconnect material consisting essentially of titanium nitride over the interlevel dielectric and into the contact openings in both of the array portion and the periphery portion, so as to make electrical contact with the selected locations of the doped regions;

etching the layer of interconnect material to provide interconnections in both of the array portion and the periphery portion; and then forming capacitor structures overlying the layer of interconnect material in the array portion; wherein the step of forming the layer of interconnect material also forms a silicide film between the layer of interconnect material and the selected locations of the doped regions.

8. The method of claim 7, wherein the doped regions include both p-type and n-type doped regions.

9. The method of claim 7, wherein the step of forming the layer of interconnect material comprises:

depositing a layer comprising titanium metal over the interlevel dielectric layer, and into the contact locations in both of the array portion and the periphery portion; and heating the body in a nitrogen ambient, so that the titanium metal reacts with the doped regions at the selected locations to form a titanium silicide film thereat, and so that remaining portions of the titanium metal converts into titanium nitride.

10. The method of claim 9, wherein the step of forming the layer of interconnect material further comprises:

after the heating step and prior to the etching step, depositing a layer consisting essentially of titanium nitride overall.

11. The method of claim 10, wherein the step of forming the layer of interconnect material further comprises:

after the heating step and prior to the step of depositing the layer consisting essentially of titanium nitride, removing the titanium nitride layer formed in the heating step.

* * * * *